(12) United States Patent
Shah et al.

(10) Patent No.: US 8,998,553 B2
(45) Date of Patent: Apr. 7, 2015

(54) HIGH THROUGHPUT LOAD LOCK FOR SOLAR WAFERS

(71) Applicant: Intevac, Inc., Santa Clara, CA (US)

(72) Inventors: Vinay Shah, San Mateo, CA (US); William Runstadler, Jr., Livermore, CA (US); Kevin P. Fairbairn, Los Gatos, CA (US); Terry Bluck, Santa Clara, CA (US); Richard Henry Cooke, Worthing (GB)

(73) Assignee: Intevac, Inc., Santa Clara, CA (US)

( * ) Notice: Subject to any disclaimer, the term of this patent is extended or adjusted under 35 U.S.C. 154(b) by 173 days.

(21) Appl. No.: 13/708,751

(22) Filed: Dec. 7, 2012

(65) Prior Publication Data

US 2013/0149075 A1    Jun. 13, 2013

Related U.S. Application Data

(60) Provisional application No. 61/568,129, filed on Dec. 7, 2011.

(51) Int. Cl.
*H01L 21/677* (2006.01)
*H01L 21/67* (2006.01)

(52) U.S. Cl.
CPC .... *H01L 21/67736* (2013.01); *H01L 21/67126* (2013.01); *H01L 21/67201* (2013.01); *H01L 21/67271* (2013.01); *H01L 21/67288* (2013.01)

(58) Field of Classification Search
CPC .......... H01L 21/67736; H01L 21/67288; H01L 21/67201; H01L 21/67126; H01L 21/67261
USPC ......................................................... 414/217
See application file for complete search history.

(56) References Cited

U.S. PATENT DOCUMENTS

| 3,924,645 | A | | 12/1975 | Neville et al. | |
|---|---|---|---|---|---|
| 3,968,018 | A | * | 7/1976 | Lane et al. | 204/192.3 |
| 4,015,558 | A | * | 4/1977 | Small et al. | 118/668 |

(Continued)

FOREIGN PATENT DOCUMENTS

| GB | 418364 A | 10/1934 |
|---|---|---|
| TW | 201332871 A | 8/2013 |
| WO | 2013086432 A2 | 6/2013 |

OTHER PUBLICATIONS

International Search Report and Written Opinion for PCT Application No. PCT/US2012/068595, dated May 13, 2013.

(Continued)

*Primary Examiner* — Kaitlin Joerger
(74) *Attorney, Agent, or Firm* — Nixon Peabody LLP; Joseph Bach, Esq.

(57) ABSTRACT

A system for transporting substrates from an atmospheric pressure to high vacuum pressure and comprising: a rough vacuum chamber having an entry valve and an exit opening; a high vacuum chamber having an entry opening, the high vacuum chamber coupled to the rough vacuum chamber such that the exit opening and the entry opening are aligned; a valve situated between the exit opening and the entry opening; a first conveyor belt provided in the rough vacuum chamber; a second conveyor provided in the high vacuum chamber; a sensing element provided in the high vacuum chamber to enable detection of broken substrates on the second conveyor; and, a mechanism provided on the second conveyor belt enabling dumping of broken substrates onto the bottom of the high vacuum chamber.

22 Claims, 5 Drawing Sheets

(56) References Cited

U.S. PATENT DOCUMENTS

| | | | |
|---|---|---|---|
| 4,047,624 A | | 9/1977 | Dorenbos |
| 4,217,977 A | * | 8/1980 | Tam ................... 198/341.07 |
| 4,693,777 A | | 9/1987 | Hazano et al. |
| 5,178,682 A | * | 1/1993 | Tsukamoto et al. ......... 118/722 |
| 6,215,897 B1 | | 4/2001 | Beer et al. |
| 7,296,673 B2 | * | 11/2007 | Blonigan et al. ........... 198/369.6 |
| 7,490,714 B2 | * | 2/2009 | Krause et al. ................ 198/817 |
| 8,382,938 B2 | * | 2/2013 | Moriya et al. ........... 156/345.31 |
| 8,459,276 B2 | * | 6/2013 | Stevens et al. .................. 134/60 |
| 2006/0283688 A1 | * | 12/2006 | Blonigan et al. ........... 198/369.6 |
| 2007/0264105 A1 | * | 11/2007 | Pharand et al. ............... 414/217 |
| 2008/0041526 A1 | | 2/2008 | Pass |
| 2009/0301525 A1 | * | 12/2009 | Ozawa et al. ................... 134/21 |
| 2011/0005899 A1 | * | 1/2011 | Grzelak ..................... 198/471.1 |
| 2011/0140019 A1 | | 6/2011 | Mahr et al. |
| 2011/0142572 A1 | | 6/2011 | Blonigan et al. |
| 2011/0171830 A1 | * | 7/2011 | Kaise et al. ................... 438/689 |
| 2011/0250357 A1 | * | 10/2011 | Willers ......................... 427/294 |
| 2011/0269256 A1 | * | 11/2011 | Black ............................. 438/61 |
| 2012/0027952 A1 | * | 2/2012 | Reising et al. ................ 427/569 |
| 2012/0042828 A1 | * | 2/2012 | Black ............................ 118/715 |
| 2012/0064250 A1 | * | 3/2012 | Baccini et al. ................ 427/282 |
| 2012/0136476 A1 | * | 5/2012 | Baccini et al. ................ 700/213 |
| 2012/0298141 A1 | * | 11/2012 | Stevens et al. .................. 134/18 |
| 2013/0020180 A1 | * | 1/2013 | Truyens ........................ 198/617 |
| 2013/0140135 A1 | * | 6/2013 | Tan et al. .................... 198/345.1 |
| 2013/0259610 A1 | * | 10/2013 | Halloran et al. ............... 414/217 |
| 2013/0269149 A1 | * | 10/2013 | Stevens et al. .................. 15/339 |
| 2014/0079514 A1 | * | 3/2014 | Polyak et al. ................. 414/217 |

OTHER PUBLICATIONS

International Preliminary Report on Patentability for PCT Application No. PCT/US2012/068595, dated Jun. 19, 2014.

* cited by examiner

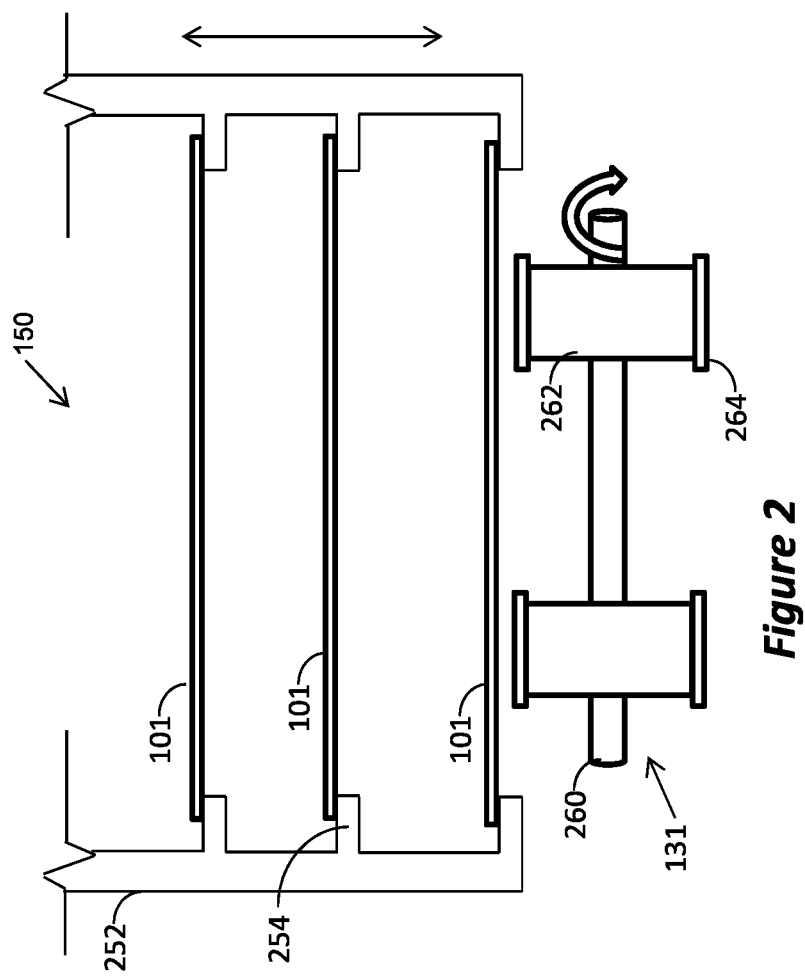

HIGH THROUGHPUT LOAD LOCK FOR SOLAR WAFERS

RELATED CASES

This Application claims priority benefit from U.S. Provisional Application Ser. No. 61/568,129, filed on Dec. 7, 2011, the disclosure of which is incorporated here by reference in its entirety.

BACKGROUND

1. Field

This invention relates to transport of substrates and, specifically, to high throughput transport of substrates from atmospheric into vacuum environment for fabrication of solar cells.

2. Related Arts

Vacuum transport of substrates has been used in the manufacture of semiconductors for many years. A typical loadlock device has one valve as entry port to receive wafers from atmospheric environment, and valve as one exit port for delivering wafers into the vacuum processing system. In many systems the entry port also used to return wafers to the atmospheric environment. In such systems, a robot arm positioned on the atmospheric side places the substrate inside the loadlock and, after vacuum is established in the loadlock, a robot arm positioned on the vacuum side of the system (e.g., a mainframe) fetches the substrate from the loadlock and places it in a vacuum processing chamber, e.g., a plasma chamber. Once processing is completed, the vacuum-side robot places the processed substrate in the loadlock, and, after establishing proper pressure, the atmospheric-side robot fetches the processed substrate out of the loadlock. While such an architecture works well for semiconductor processing, solar cell fabrication requires much higher throughput. For example, while semiconductor processing proceeds at a rate of around 60-100 wafers per hour, solar cell fabrication proceeds at the rate of 1500-2500 wafers per hour. Thus, a new loadlock architecture is needed to facilitate such high throughput.

Additionally, due to the high speed processing of solar cells, and the relative low cost of each individual cell as compared to a semiconductor substrate, wafer breakage is a relatively frequent and an acceptable event in solar cell fabrication, while it is not acceptable in semiconductor processing. Still, the system needs to be able to recognize and handle events of wafer breakage. This is especially the case where wafer breaks inside the vacuum environment, where no manual identification and handling of the broken wafer can be performed without breaking vacuum and disassembling parts of the system. Accordingly, improvements in systems for manufacturing of solar cells are needed to identify and handle wafer breakage.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments provide loadlock architectures that enable high throughput fabrication of solar cells. Disclosed embodiments enable identification of broken substrates and disposal of these substrates. Disclosed embodiments also enable replacement of broken substrates without halting processing.

Disclosed embodiments provide a two-stage loadlock wherein conveyor belts are used for wafer transport inside the loadlock. The first stage is a low vacuum loadlock that is configured for rapid pumping from atmospheric pressure to rough, partial vacuum environment, referred to also as low vacuum environment. A conveyor belt is situated inside the first stage and handles transport of wafers into the first stage and out to the second stage. Provisions are made to ensure that the wafers do not move during the rapid pump from atmospheric to partial vacuum pressure inside the first stage. The second stage is a high vacuum stage and has conveyor to transfer wafers into the high vacuum stage and into the vacuum processing chamber. The second stage includes means for identifying and disposing of broken wafers. Also, an optional loader can be provided in the second stage to replace broken wafers with good wafers, so that the system can continue processing at its regular cycle.

Various embodiments disclosed herein provide for a low volume roughing loadlock with perforated conveyor belts, each belt having at least one vacuum plate with vacuum channels coupled to vacuum conduits, and valves provided on the conduits to control the vacuum and the pumping and venting from the plate, such that the wafers are prevented from moving during pump or vent of the loadlock.

Also, a high vacuum chamber is provided, which serves a vacuum transition and buffer chamber from rough vacuum to high vacuum, and also serves as a broken wafer screening and replacement chamber prior to the process chambers. In disclosed embodiments, the HVLL chamber contains a wafer imaging source such as a CIS or camera. The CIS or camera could be mounted inside or outside of vacuum using a lens or window.

In disclosed embodiments, the HVLL contains a wafer storage device and a wafer dump. The wafer dump removes broken wafers from the conveyors and stores them in a safe location to be disposed of later. The wafer storage is used to replace the broken wafers and keep the process flow uninterrupted.

In disclosed embodiments, a system is provided, wherein wafers broken in the LVLL or moved into the LVLL are moved from the LVLL to the HVLL without blocking the wafer path or slot valve. This could be done by, e.g., a conveyor that extends through the slot valve between chambers after the valve is open and retracts before the valve closes. It is better if the belt extends only from the HVLL, so as to keep the LVLL volume as small as possible. Alternatively the perforated belt in the LVLL could extend thru the valve into the adjacent chamber or in the case of the out going loadlock the belt could extend into the atmospheric handling area.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 2 is a schematic of a replacement wafer station according to one embodiment.

DETAILED DESCRIPTION

Various embodiments disclosed herein enable high throughput of substrates from atmospheric environment into vacuum environment. The high throughput enabled by these embodiments is particularly suitable for solar cell fabrication, although it may be used for fabrication of other items, especially when there's a need to transfer the processed item from atmospheric environment into vacuum environment. Examples where transfer of substrates from atmospheric environment into vacuum environment include: chemical vapor deposition (CVD), physical vapor deposition (PVD), ion implant, etc. The disclosed two-stage linear loadlock is particularly suitable to linear fabrication systems, wherein the substrates enter the loadlock from entry port on one side and exit through exit port on the opposite side, and are not returned to atmosphere through the entry port.

High speed processing is susceptible to substrate breakage. In standard semiconductor processing systems, such an event requires a shut down of the system, disassembly of the system, and manual cleaning of the substrate debris. However, in solar cell fabrication environment, shutting off the system and manual cleaning of debris are unacceptable, due to the long downtime required. As an example, if a semiconductor system is shut down for one hour, production of about 60 wafers may be lost. On the other hand, if a solar system is shut down for one hour, production of up to 2500 solar cells may be lost. Such a high lost of production is highly detrimental in the highly competitive, low margins market of solar cell fabrication. Accordingly, embodiments of the invention include features that enable continued processing regardless of wafer breakage. It should be appreciates, however, that the various features disclosed can be used independently of each other, or in any combination with each other. For clarity, each disclosed embodiment may include all of the features to illustrate the synergistic function of all of the features, but the use of all of the features in a single system is not mandatory.

Figure 1:
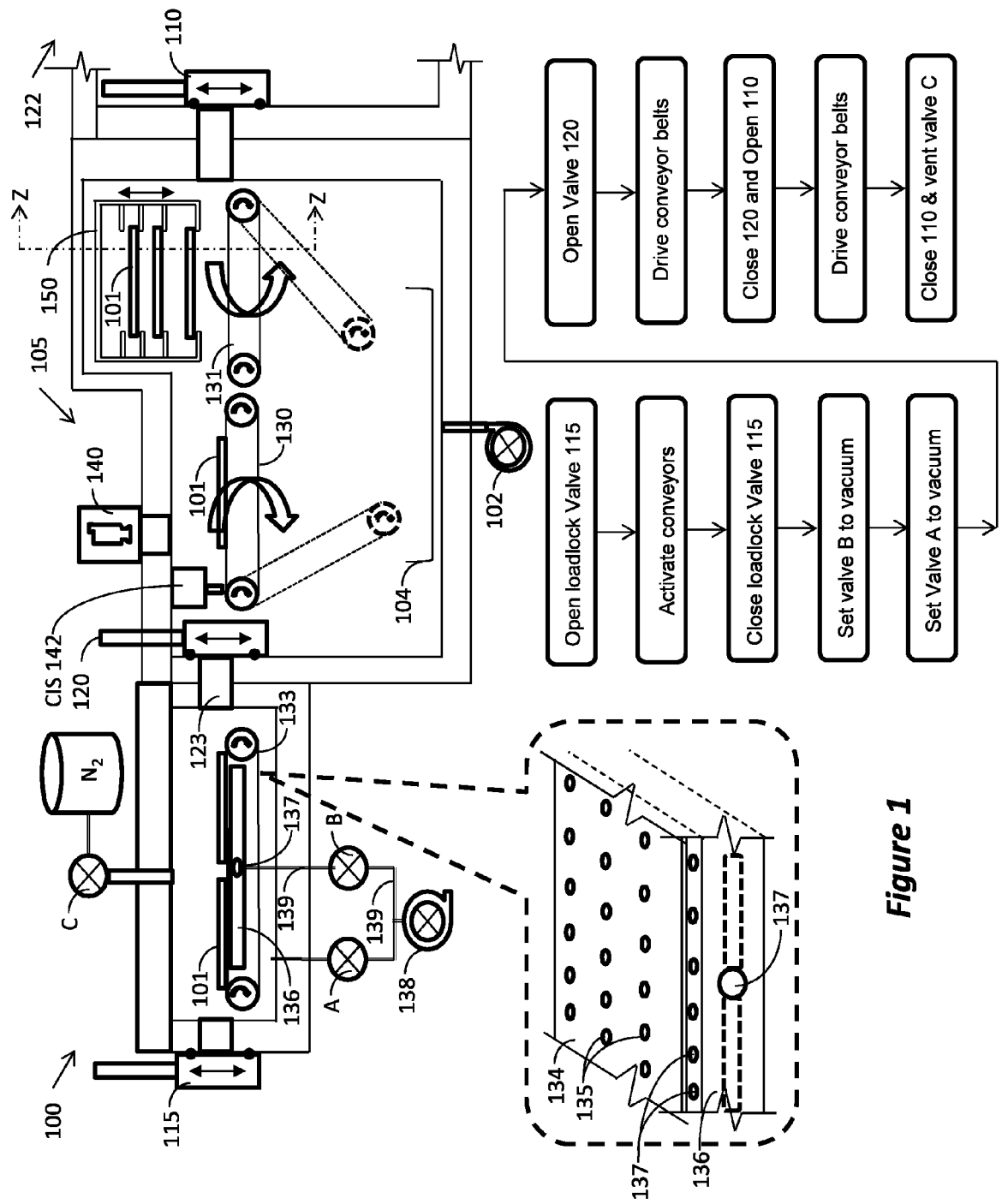
FIG. 1 is a schematic of a two-stage linear loadlock arrangement according to one embodiment.

FIG. 1 illustrates a schematic of a two-stage, linear loadlock arrangement according to one embodiment. The arrangement is referred to as a two-stage system, as the pressure is reduced from atmospheric to high vacuum level in two stages. The arrangement is referred to as linear as the wafers always travel in one linear direction and never reverse direction, as is done in standard, robot arm based. Semiconductor systems.

In this embodiment, a first loadlock chamber 100 is a low vacuum loadlock (LVLL) chamber that cycles from atmospheric pressure to rough, low (or intermediate) vacuum pressure. Low vacuum pressure means that it is below atmospheric pressure, but higher pressure than the high vacuum level required in the processing chamber. The volume of loadlock 100 is very small and is connected to vacuum pump 138 via vacuum conduits 139 and valve (A), to enable rapid pumping down from atmospheric pressure to rough vacuum pressure. Loadlock chamber 105 is a high vacuum loadlock (HVLL) and is maintained at high vacuum pressure by, e.g., a turbo pump 102. The vacuum level maintained in the HVLL can be commensurable with the pressure required for processing. Regardless, the volume of the HVLL is much larger than that of the LVLL, such that when a gate is opened between these two chambers, the residual pressure in the LVLL is rapidly diluted to high vacuum level of the HVLL. Effectively, as wafers traverse these two loadlock chambers they are moved from atmospheric pressure to processing pressure in two stages.

Substrates 101 are loaded from atmospheric environment into loadlock 100 via valve 115. From there they are transferred into loadlock 105 via valve 120, and then to processing chamber 122 via valve 110. Chamber 122 is not illustrated, as it is not relevant to the structure and/or operation of this embodiment. Chamber 122 is not necessarily a processing chamber, but rather may be, for example, a buffer station, a cooling station, a heating station, etc. The idea here is that chamber 122 is maintained in vacuum at a level similar to that in loadlock chamber 105.

While two substrates are illustrated inside loadlock 100 of FIG. 1, as can be appreciated, multiple rows of wafers can be loaded simultaneously into loadlock 100. For instance, there could be a single-wafer per cycle, a single row of 3 wafers per cycle, two rows of three wafers for a total of six wafers per cycle, etc. The idea here is to balance transport time and pump time so as to provide the required throughput at the required cycle time. The cycle time should be calculated based on the processing time in the processing chambers, such that the chambers are always fed with fresh substrates and do not idle waiting for wafers to be transported, i.e., wafer transport should not form a bottleneck for the processing chambers.

To illustrate, conveyor 133 is shown with two wafers, conveyor 130 is shown with one wafer, and conveyor 131 is shown with no wafers. However, generally, the conveyors will carry the same number of wafers, so that at each cycle the exact number of wafers will be transferred from conveyor 133 to conveyor 130, from conveyor 130 to conveyor 131, and from conveyor 131 to processing chamber 122. In this embodiment, each row has its own conveyor, and only one row can be seen in this perspective, and additional rows would be obscured by the illustrated conveyors.

Once the substrates have been transferred into loadlock 100, the chamber is sealed and vacuum is rapidly drawn in order to obtain the required throughput. However, when high rate vacuum pumping is performed, the rapid air flow may cause the substrates to shift their position on top of the conveyor belt. This may lead to misalignment and/or breakage of wafers. Therefore, as illustrated more clearly in the callout of FIG. 1, according to one embodiment, a perforated flexible belt 134 having perforations 135 is used to hold the wafer(s) in place during turbulent pumping or venting of the loadlock. The perforated flexible belt 134 travels over a perforated base plate 136, having perforations 137 on its upper surface upon which the perforated belt 134 travels. The base plate 136 has vacuum channels in its interior (not shown) leading to the perforations 137. The perforated base plate 136 is coupled to the vacuum pump 138 via vacuum conduits 139 and valve (B), such that when valve (B) is set to vacuum, pump 138 draws vacuum through the perforated base plate 136 and through the perforated belt 134, thus holding the wafer(s) in place. In this embodiment, the conveyor belt is stationary during pump down and during venting of the base plate. Note that venting of the base plate 136 may not be required in order to enable wafers transport onto belt 130, since once the LVLL chamber is evacuated, the pressure equalizes such that there's no more vacuum force on the substrates. That is, after pumping the LVLL, the pressure in the LVLL will be the same as the pressure in the base plate, so that the gripping force will be gone. The gripping force only exists during the first part of the pump down. In operation, the base plate is pumped first to create a pressure delta between the rest of the LVLL volume and the base, which causes the wafer to be gripped. As the rest of the LVLL volume pumps down, the pressure delta gets smaller and smaller, as does the gripping force. Nevertheless, if venting is needed, it can be done by setting valve (B) to vent position, which may couple the base plate to atmosphere or to inactive gas, such as nitrogen, bringing the interior channels of base plate 136 to atmospheric pressure.

For example, when new wafers are introduced into the loadlock 100 and the valve 115 is closed, the conveyor belt valve (B) is set to vacuum for about 0.1 seconds before the chamber pump valve (A) is opened (set to vacuum position). This causes the wafers to be pressed against the belt and prevents the wafers from being moved around and possibly broken during pump down of the chamber 100. Then, when gate 120 is opened to transfer the wafers into chamber 105, the nitrogen vent valve (C) is opened while the conveyor belt vacuum valve (B) is still open (set to vacuum position). This holds the wafer down through the turbulent vent flow. Once the appropriate pressure is reached, the belt can be energized to move the wafer to the next stage.

There is a second function of the perforated belt, which is to prevent air from being trapped between the belt and the wafer. If air is trapped under the wafer, it will eventually get pumped out, e.g., during vacuum pumping, causing the wafer to slide/twist. This second function is independent of the vacuum channels in the base plate. Therefore, the feature of perforated belt can be employed even if the base plate 136 does not have vacuum channels. The vacuum pumping arrangement to base plate 136 is, therefore, optional.

The general process that can be followed to transfer wafers through the two-stage system is illustrated in FIG. 1 as well, providing the reader with a single view of the hardware and process flow. In this example, the process starts after loadlock 100 has been vented, e.g., by opening valve (C) to flow nitrogen into the loadlock 100 until it reaches atmospheric pressure or by flowing air into the chamber. In this embodiment, at this stage the loadlock 100 is empty, i.e., no wafers are positioned on conveyor belt 133 (the wafers have already been transferred to loadlock 105). Loadlock valve 115 is then opened, and conveyor belt 133 is activated to load wafers into loadlock 100. The valve 115 is then closed and valve (B) is set to vacuum position, so that the vacuum suction in conveyor 133 from pump 138 holds down the wafers. Valve (A) is then set to vacuum to rapidly evacuate the loadlock 100. When the appropriate vacuum level is reached in loadlock 100, valves 120 is opened, and the conveyors are activated to transfer wafers from each convey 133 to conveyor 130. Then valve 120 is closed and HVLL 105 is pumped to high vacuum level. Valve 110 is then opened and the wafer is transferred from conveyor 131 into the chamber 122. In this way, the LVLL cycles between atmospheric pressure and low vacuum level, while the HVLL cycles between low vacuum and high vacuum levels. The process chamber 122 is never exposed to low vacuum level, but rather only to the high vacuum level of HVLL. When valve 120 is closed, valve (C) can be set to vent. The process then repeats itself for the next cycle.

In the embodiment illustrated in FIG. 1, provisions are made to detect and dispose of broken wafers. A camera 140 or a contact image sensor (CIS) 142 is used to create an image of the wafer in the HVLL 105. The image is then used to determine whether each wafer is intact or broken. If the wafer is not intact, it is dumped and, optionally, is replaced by a wafer from a wafer stocker 150 positioned over each row of wafer conveyors. As shown in the example of FIG. 1, the feature of dumping the broken wafer is implemented by one or both of the conveyors 130 and/or 131 having swinging capability over one or both rotational axis. This is illustrated by the curved arrows and the conveyors shown in broken lines in their wafer dump position. The wafers can be dumped into collection tray 104, which may be emptied at regular system servicing periods.

Also illustrated in FIG. 1 is the optional storage station, also referred to as stocker, 150 for replacement wafers. In this embodiment, the storage station 150 can move vertically, as shown by the double-headed arrow, so as to deposit wafers of conveyor 131 as needed. Alternatively, conveyor 131 can be moved vertically to collect replacement wafers from the stocker 150. The wafer storage or stocker 150 is loaded with wafers 101 at the start of each run and as needed during a run. For instance, if the storage 150 holds 4 wafers over 3 rows, then the first 12 wafers that are loaded into the system are not transferred to the processing chamber, but rather are loaded into the storage as replacement wafers. Then, broken wafers can be replaced with wafers from the storage 150 without interruption of the system and without skipping a processing cycle. Again, the idea is that at each cycle the processing chamber is fed with wafers so that it is not idling. The wafers remaining in the stocker 150 would then be the last wafers processed at the end of the run, less any that were used to replace broken wafers.

FIG. 2 illustrates an embodiment of wafer storage over one row of the wafer conveyor 131. The view shown in FIG. 2 is a cross-section along line Z-Z of FIG. 1. The wafer storage 150 includes a housing 252 that is transportable vertically, as illustrated by the double-headed arrow. Shelves 254 are positioned inside the housing 252 to support several replacement wafers 101. Conveyor 131 is shown as having rotating shaft 260, rollers 262, and flexible belt 264 riding on rollers 262. To fill the storage with wafers, the storage housing 252 is lowered around an empty conveyor 131, until the top shelf 254 is below the conveyor 131. Then, the conveyor 131 is energized and a wafer is brought into the loadlock chamber 105 and onto conveyor 131. When the wafer on conveyor 131 is aligned with the top shelf 254, the conveyor is stopped and the storage housing 252 shifts up one slot to pick up the wafer from the conveyor. This process is repeated until the storage shelves 254 are all full. Conversely, to replace a broken wafer, the storage housing 252 lowers until the bottom wafer remaining on the storage shelves 254 is transferred to the conveyor 131.

Figure 3B:
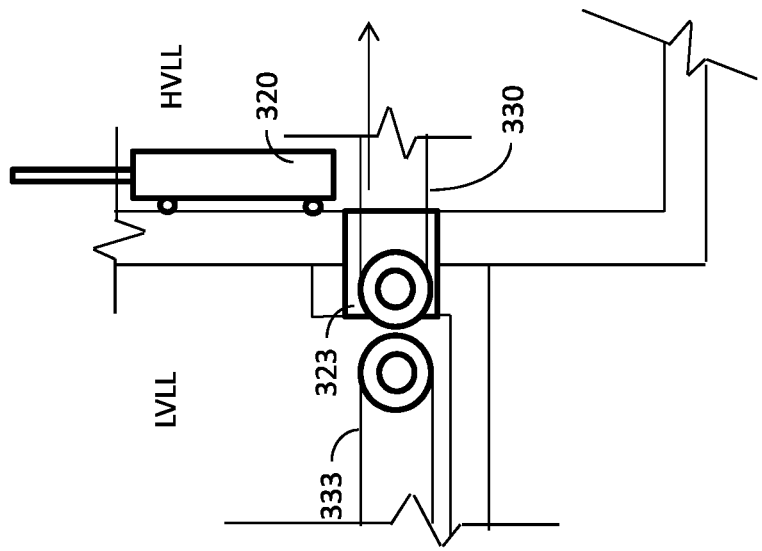
FIGS. 3A and 3B illustrate schematic of a retractable conveyor, according to one embodiment.
Figure 3A:
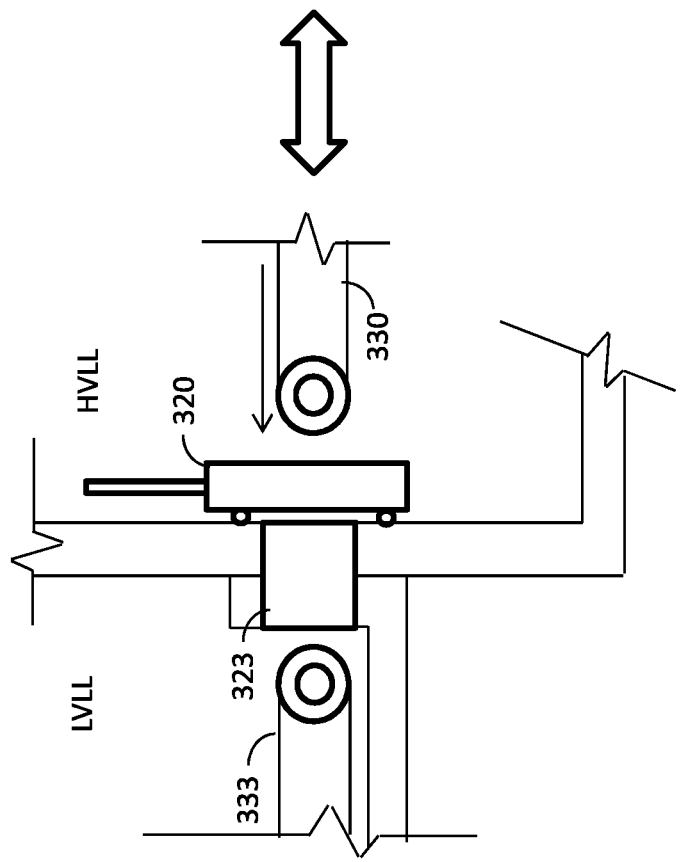
Figure 4:
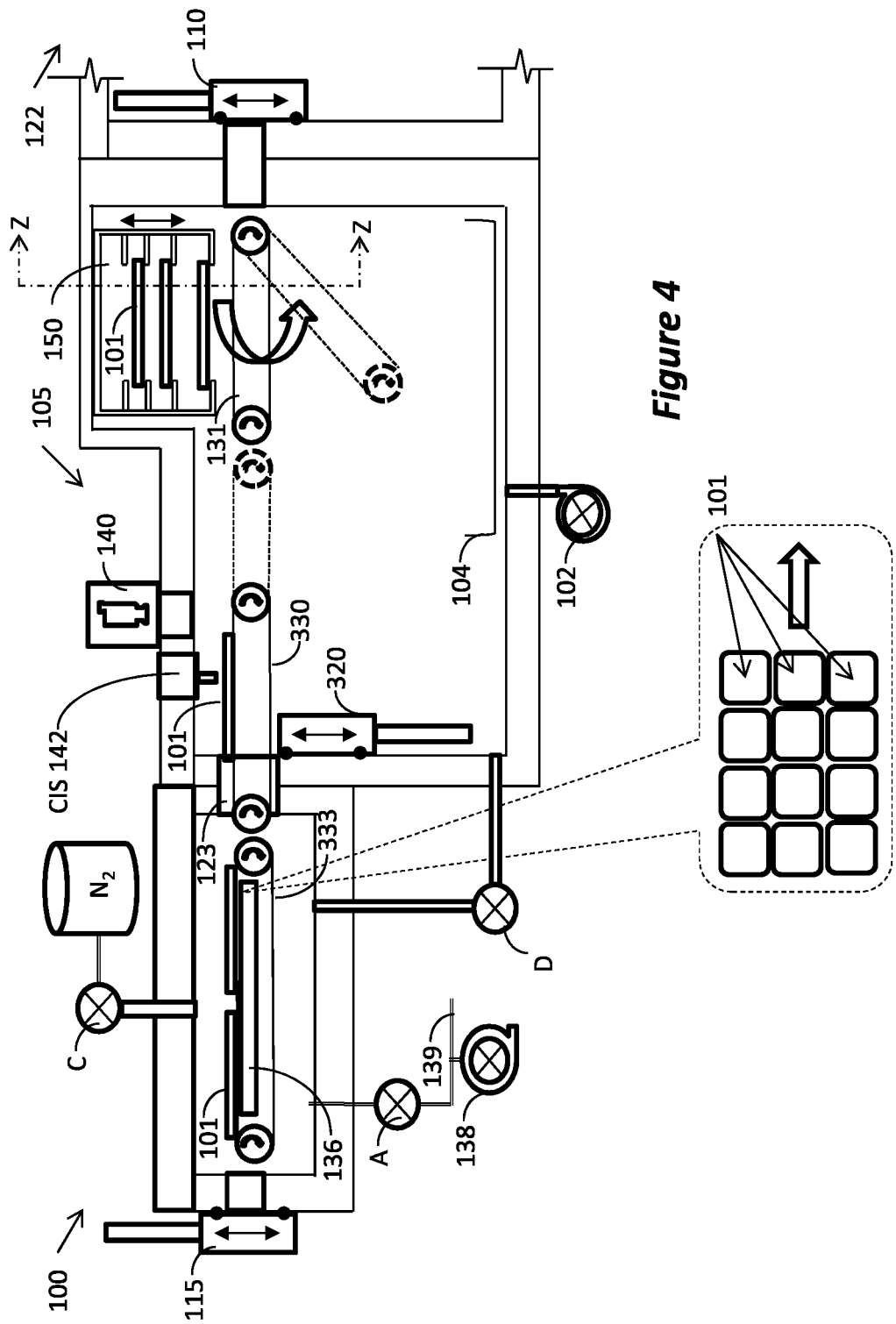
FIG. 4 is a schematic illustrating an extended movable conveyor belt according to one embodiment.

In the embodiment of FIG. 1, the wafers traverse two loadlock chambers, i.e., from loadlock 100 to loadlock 105. The wafers are transferred via slot 123, which can be sealed by vacuum valve 120. So long as the wafers are intact, full size wafers can easily traverse the gap of slot 123, since the gap is much smaller than the size of the wafer. However, if the wafer is broken, small pieces can be dropped inside the slot 123, and potentially damage the vacuum valve 120. FIGS. 3A and 3B are close views illustrating a feature that enables handling broken wafers in loadlock chamber 100 and preventing pieces from being deposited in slot 123. FIG. 4 illustrates an embodiment of a system using the features of FIGS. 3A and 3B.

According to an embodiment illustrated in FIGS. 3A and 3B, to mitigate wafer broken in loadlock 100, after the slot valve 320 between chambers 100 and 105 is opened (FIG. 3B), the conveyor assembly 330 from the HVLL chamber 105 is extended through the valve 320 and slot 323 to near the LVLL 100 conveyor 333 (alternatively, the conveyor from the LVLL can be extended through the slot into the HVLL chamber). At this position, the two belts are close enough to each other such that broken pieces can easily be transported from belt 333 to belt 330. Once the wafer and broken pieces have been transferred to belt 333, the conveyor is retracted (FIG. 3A) and the valve 320 is closed. In this way, as shown in FIG. 4, any broken wafers are transported to the HVLL chamber 105 where the CIS 142 or camera 140 will be used to determine whether they are broken. If broken wafers are found, belt 330 is energized to transfer the broken pieces to belt 131. Belt 131 can then be tilted about its tilting axis to its inclined orientation so as to dump the broken pieces into tray 104. The belt 131 can then be returned to its horizontal position and load a replacement wafer from the stocker 150. Incidentally, the callout in FIG. 4 illustrates that several rows of wafers can be handled simultaneously, as explained but not shown in FIG. 1, so as to avoid clutter in FIG. 1. Also, the embodiment of FIG. 4 omits the vacuum pumping of the base plate, as this feature is optional. A perforated belt is still used, so that air may not be trapped between the wafers and the belt.

FIG. 4 illustrates another optional feature, which is equalization valve D. As can be seen, an opening is provided at the bottom of the LVLL chamber, which leads to piping to equalization valve D. The other side of equalization valve D leads to the HVLL. The purpose of this valve is as follows. After pumping the LVLL, the pressure will be around 1 torr or so. This is not a very good vacuum level, and consequently there are still a lot of air molecules in the LVLL. The HVLL is typically at a pressure around $1 \times 10^{-5}$ torr. If we simply open valve 120, the air molecules in the LVLL will rush past the wafer and through valve 120 in order to equalize pressure between the low vacuum level and high vacuum level. That rush can cause the wafer to slide/twist. The equalization valve D provides an airflow path for equalization of pressure that causes air to flow down toward the bottom of the chamber. So, while there is still a rush of air, the direction of flow is such that it pushes the wafer down against the conveyor instead of pushing it forward toward the valve. As a result, the wafer does not move.

Figure 5:
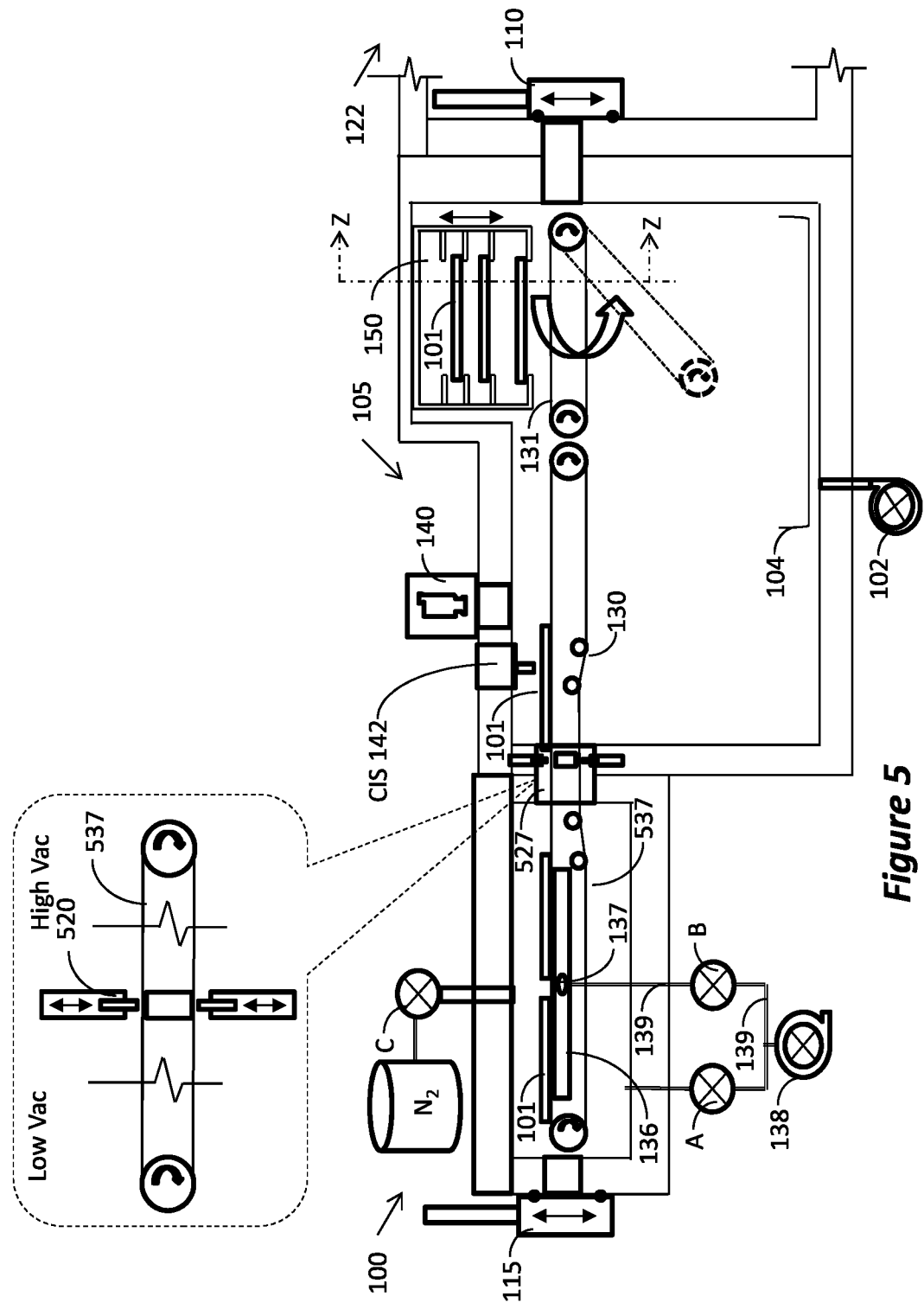
FIG. 5 is a schematic illustrating a conveyor arrangement according to another embodiment.

FIG. 5 illustrates another method for dealing with broken wafers in the LVLL 100. According to this embodiment, a thin perforated conveyor belt 537, such as a perforated Mylar belt, is stretched between the LVLL chamber 100 to the HVLL chamber 105. Belt 537 is configured to move wafers from entry valve 115 all the way through slot 527, and into HVLL chamber 105. In this way, there's no transfer of wafers from one belt onto another over the slot 527, thereby avoiding the potential for breakage pieces falling into slot 527. From belt 537 the wafers may pass directly to belt 131.

The special arrangement of the thin belt is illustrated in the close view in the callout of FIG. 5. Specifically, the thin belt 537 is designed such that valve 520 can be closed directly on the belt, when the belt is not in motion. Since both chambers 100 and 105 are under vacuum environment, the valve need not press too hard on the thin belt 537, since the small flow through the belt is tolerable and will not adversely affect the performance of the system.

As can be understood, in the embodiment of FIG. 5, the thin belt, such as Mylar perforated belt, is threaded through a narrow slit between the low vacuum load lock 100 and high vacuum load lock 105. The conveyor belt 537 is energized intermittently rather than continuously, wherein during each energized state it transports one, or one column, of wafers, referred to as "one pitch" or "one cycle." When the conveyor belt 537 stops its motion, the valve 520 closes and presses on the conveyor belt 537, to thereby separate the environment inside the high vacuum load lock 105 from that of low vacuum load lock 100. Such an arrangement minimizes the gaps between conveyor belts that the wafers have to traverse so as to minimize breakage.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A loadlock chamber configured for transferring substrates from atmospheric environment into vacuum environment, comprising:
   a vacuum sealable chamber body;
   an entry valve provided on one side of the chamber body and sealing the chamber body from atmospheric environment;
   an exit valve provided on opposite side of the chamber body and sealing the chamber body from high vacuum environment;
   an evacuation pump coupled to the chamber body and operable to draw vacuum inside the chamber body;
   a broken substrate collection bin;
   at least one conveyor comprising a tilting mechanism configured for tilting the conveyor away from its horizontal transport position so as to dump broken substrates into the broken substrate collection bin.

2. The loadlock chamber of claim 1, wherein the exit valve is coupled to a high vacuum chamber, and wherein the conveyor is configured to extend into the high vacuum chamber.

3. The loadlock chamber of claim 2, wherein the conveyor comprises a belt and wherein the exit valve is configured to assume closed position by pressing on the belt.

4. The loadlock chamber of claim 1, further comprising nitrogen supply valve operable to flow nitrogen into the chamber body.

5. The loadlock chamber of claim 1, wherein the conveyor comprises a perforated flexible belt riding over a base plate and wherein the base plate has vacuum channels and is coupled to a vacuum conduits; and, at least one vacuum valve is attached to the vacuum conduits and is operable to control vacuum pumping from the base plate.

6. A system for transporting substrates from an atmospheric pressure to high vacuum pressure, comprising:
   a rough vacuum chamber having an entry valve and an exit opening;
   a high vacuum chamber having an entry opening, the high vacuum chamber coupled to the rough vacuum chamber such that the exit opening and the entry opening are aligned;
   a separation valve situated between the exit opening and the entry opening;
   a first conveyor provided inside the rough vacuum chamber and transporting substrates from atmospheric environment into the rough vacuum environment inside the rough vacuum chamber;
   a second conveyor arrangement provided in the high vacuum chamber;
   a sensing element provided in the high vacuum chamber to enable detection of broken substrates; and,
   a disposal mechanism provided in the high vacuum chamber enabling dumping of broken substrates into a collection bin wherein the disposal mechanism comprises a tilting mechanism configured for tilting the second conveyor arrangement away from its horizontal transport position so as to dump the broken substrates into the collection bin.

7. The system of claim 6, wherein the first conveyor comprises a perforated belt and wherein vacuum is created below the perforated belt to urge substrates against the perforated belt.

8. The system of claim 7, wherein the first conveyor further comprises a base plate having vacuum channels and at least one vacuum valve to control vacuum pumping from the vacuum channels.

9. The system of claim 6, further comprising a first vacuum valve controlling vacuum suction from the first conveyor and a second vacuum valve controlling vacuum suction from the rough vacuum chamber.

10. The system of claim 6, further comprising a substrate storage device configured to load new substrate onto the second conveyor arrangement, so as to replace the broken substrates.

11. The system of claim 10, wherein the wafer dump comprises a swiveling mechanism in the second conveyor belt.

12. The system of claim 7, wherein the second conveyor arrangement comprises at least one retractable conveyor configured for retractably extending into the rough vacuum chamber through the valve.

13. The system of claim 10, wherein the second conveyor arrangement comprises two conveyor belts, a first belt configured for receiving substrates from the first conveyor and a second belt configured to receive substrates from the first belt and transport them to exit the high vacuum chamber.

14. The system of claim 13, wherein the second belt is positioned to receive substrates from the storage device.

15. The system of claim 14, wherein the storage device is configured to be vertically movable for depositing and removing wafers from the second belt.

16. The system of claim 6, wherein the first conveyor comprises a thin belt extending into the high vacuum chamber, and wherein the separation valve is configured to assume its close position by pressing against the thin belt.

17. The system of claim 16, wherein the thin belt comprises a perforated belt.

18. The system of claim 6, further comprising an equalization valve having entry port coupled to bottom of the rough vacuum chamber and exit port coupled to the high vacuum chamber.

19. A high vacuum loadlock, comprising:
a sealable chamber body having an entry opening configured for coupling to a rough vacuum loadlock and further having an exit valve configured for coupling to a vacuum processing chamber;
at least one conveyor belt configured for transporting substrates;
a sensing element provided in the sealable chamber body to enable detection of broken substrates on the conveyor belt; and,
a mechanism provided on the conveyor belt enabling the belt to swivel as to assume a tilted from horizontal to dump broken substrates onto a collection bin at bottom of the sealable chamber body.

20. The high vacuum loadlock of claim 19, further comprising a substrate storage device configured to deposit fresh substrates to replace the broken substrates.

21. The high vacuum loadlock of claim 20, further comprising a second conveyor belt situated to receive the fresh substrates from the substrate storage.

22. The high vacuum loadlock of claim 19, wherein the at least one conveyor belt comprises a first belt and a second belt, and wherein at least one of the first belt and second belt is configured to swivel so as to assume a position tilted from horizontal so as to dump substrates positioned thereupon.

* * * * *